(12) United States Patent
Choi

(10) Patent No.: US 12,406,957 B2
(45) Date of Patent: Sep. 2, 2025

(54) SPACERS FOR SEMICONDUCTOR DEVICE ASSEMBLIES

(71) Applicant: Micron Technology, Inc., Boise, ID (US)

(72) Inventor: Bong Woo Choi, Singapore (SG)

(73) Assignee: Micron Technology, Inc., Boise, ID (US)

( * ) Notice: Subject to any disclaimer, the term of this patent is extended or adjusted under 35 U.S.C. 154(b) by 521 days.

(21) Appl. No.: 17/890,834

(22) Filed: Aug. 18, 2022

(65) Prior Publication Data

US 2024/0063166 A1   Feb. 22, 2024

(51) Int. Cl.
*H01L 23/00* (2006.01)

(52) U.S. Cl.
CPC .............. *H01L 24/32* (2013.01); *H01L 24/16* (2013.01); *H01L 24/73* (2013.01); *H01L 2224/16225* (2013.01); *H01L 2224/32225* (2013.01); *H01L 2224/73204* (2013.01)

(58) Field of Classification Search
CPC .......... H01L 24/32; H01L 24/16; H01L 24/73
See application file for complete search history.

(56) References Cited

U.S. PATENT DOCUMENTS

2014/0110856 A1* 4/2014 Lin ................... H01L 23/49816
                                                                  257/774
2019/0164909 A1* 5/2019 Chang Chien .......... H01L 24/19

* cited by examiner

*Primary Examiner* — Errol V Fernandes
(74) *Attorney, Agent, or Firm* — Dorsey & Whitney LLP

(57) ABSTRACT

A semiconductor device assembly including a substrate; a frame structure disposed on the substrate, the frame structure comprising peripheral walls defining an enclosed region; and a spacer disposed on the substrate within the enclosed region and restrained by the frame structure. A method of forming a semiconductor assembly, including forming a frame structure on a substrate, the frame structure comprising peripheral walls defining an enclosed region; attaching a semiconductor die to the substrate, the semiconductor die being adjacent to the frame structure; and dispensing a spacer on the substrate within the enclosed region, the spacer being restrained by the frame structure.

19 Claims, 8 Drawing Sheets

SPACERS FOR SEMICONDUCTOR DEVICE ASSEMBLIES

TECHNICAL FIELD

The present disclosure generally relates to semiconductor devices, and more particularly relates to spacers for semiconductor device assemblies.

BACKGROUND

Semiconductor dies, including memory chips, microprocessor chips, logic chips, and imager chips are typically assembled by mounting a plurality of semiconductor dies, individually or in die stacks, on a substrate in a certain pattern. The assemblies can be used in mobile devices, computing, and/or automotive products. Spacers made of silicon can be used to support overhanging portions of large chips in the semiconductor device assemblies. Specifically, silicon spacers may help adhesively hold the semiconductor dies together prior to encapsulation and provide clearance for wire bonds loops between the semiconductor dies to the substrate or a high-level packaging. Although the silicon spacer fabrication is compatible with standard semiconductor device processes, it is sensitive to residues disposed on the substrate surface and could be cracked or delaminated during the semiconductor assembly processes.

Figure 1A:
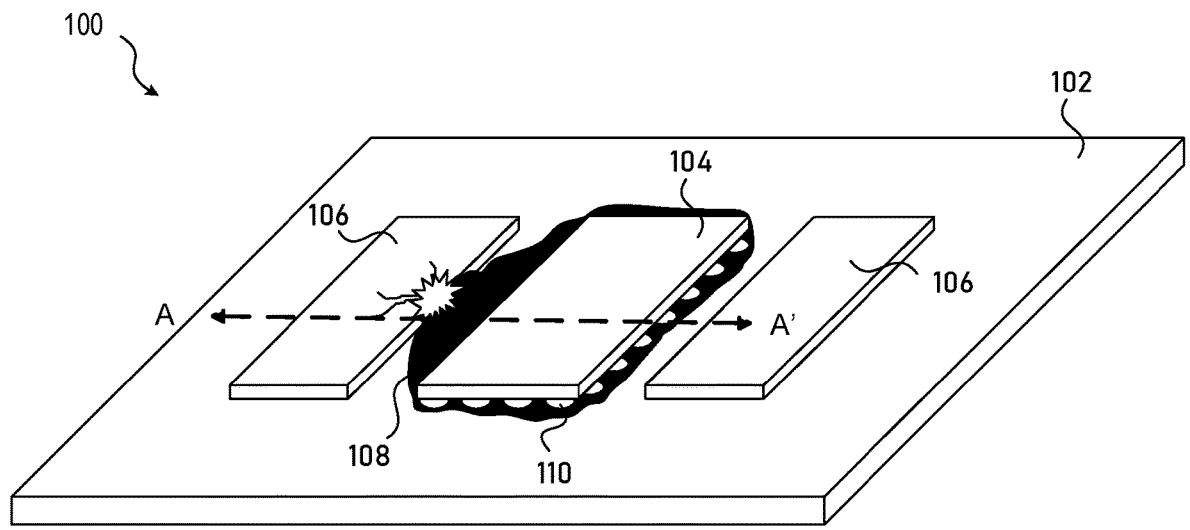
FIG. 1A depicts a perspective view of a semiconductor device assembly including silicon spacers.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION

Conventional semiconductor assemblies utilize silicon spacers to support semiconductor components in a stacking structure prior to encapsulation, as well as providing clearance or standoff for wire bonding loops between the semiconductor components and a package substrate or other higher-level packaging. In addition, silicon spacers may be used in semiconductor device assemblies to improve packaging manufacturing processes yield. However, there is always a risk of delamination between the silicon spacer and the substrate. The spacer delamination may be caused by semiconductor die underfill material bleeding out under the silicon spacer. Further, foreign materials or residues introduced to spacer regions can also introduce additional mechanical stress on the spacers and lead to cracking thereon. An open circuit or other electrical failure may occur due to the spacer delamination and cracking, and the semiconductor assemblies can eventually fail to operate.

Various methods have been developed to improve the adhesion between the silicon spacer and substrate. For example, double side grinding has been conducted on both sides of the silicon spacer in order to increase surface roughness of the silicon spacer surfaces and adhesion thereon. In another approach, additional substrate cleaning processes has been applied to the semiconductor assemblies before attaching the silicon spacers. Those additional grinding or cleaning processes introduces additional fabrication steps and challenges, and therefore leads to a higher cost of silicon spacer processing for semiconductor device assemblies.

To address these challenges and others, the present technology applies frame structures to form spacers in semiconductor device assemblies. In particular, the present technology fabricates the frame structure on the substrate, the frame structure having peripheral walls and an enclosed region defined by the peripheral walls. Then spacer material is dispensed into the enclosed region of the frame structure to form spacers. The frame structure and the spacer can be made of solder resist and solder paste, respectively. In particular, the spacers can be partially embedded in the enclosed region of the frame structure and restrained by the frame structure. The spacers can have a height similar or higher than the frame structure to provide mechanical support on semiconductor dies disposes there above. Further, the frame structure can be disposed next to a semiconductor die and is configured to prevent underfill material bleeding out from the adjacent semiconductor die to the spacers. Moreover, the present technology can provide flexible sizes and locations for the spacers which allow different configurations of the semiconductor assemblies to accommodate various semiconductor die scaling requirement and additional semiconductor dies/die stacks configurations.

FIG. 1A depicts a perspective view of a semiconductor device assembly 100 with silicon spacers 106. The semiconductor device assembly 100 includes a substrate 102 and a semiconductor die 104 disposed on a top surface of the substrate 102. In addition, the silicon spacers 106 are disposed on the top surface of the substrate 102 and adjacent to the semiconductor die 104. As shown, the semiconductor die 104 is attached on the substrate 102 through solder bumps 110 and underfill adhesive material 108.

The underfill adhesive material 108, e.g., epoxy material, is commonly provided to fill the space between the bottom of the semiconductor die 104 and the top surface of the substrate 102 and between the solder bumps 110 to improve the semiconductor die 104 temperature cycling capability. In addition, the underfill adhesive material 108 is generally made of low viscosity epoxy material and is disposed around the perimeter of the semiconductor die 104. The filling of epoxy materials under the semiconductor die 104 relies on capillary action to uniformly draw the epoxy material when it is still in liquid phase into the interior spaces between the semiconductor die 104 bottom surface and the substrate 102 top surface.

The silicon spacers 106 shown in FIG. 1A can be cut or singulated silicon pieces, or other suitable materials, disposed on the substrate 102 and adjacent to the semiconductor die 104. The silicon spacers 106 are usually configured to have a top surface equal to or slightly above a top surface of the semiconductor die 104 to provide mechanical support to additional semiconductor dies or die stacks disposed there above. The silicon spacers 106 can be secured on the substrate 102 by adhesive materials including adhesive past, adhesive tape, etc. The semiconductor device assembly 100 may include a b-state resin or solder paste to replace the silicon spacers 106 for similar applications.

One of the issues usually encountered during the semiconductor device assembly 100 is underfill epoxy bleed out which further lead to spacer defects. The underfill epoxy bleed out is a separation of certain formulation ingredients from the underfill epoxy material. Depending on the semiconductor die 104 solder paste formulations and substrate 102 morphology, the bleeding ingredients can also be solvents, low molecular weight resins, or additive adhesion promoters. The epoxy bleed out tends to occur on high energy surfaces such as silicon substrate without any organic coatings. Moreover, the epoxy bleed out can occur once the underfill epoxy material 108 is dispensed between the silicon spacers 106 and the semiconductor die 104. Further, the epoxy bleed out can happen during thermal curing.

Figure 1B:
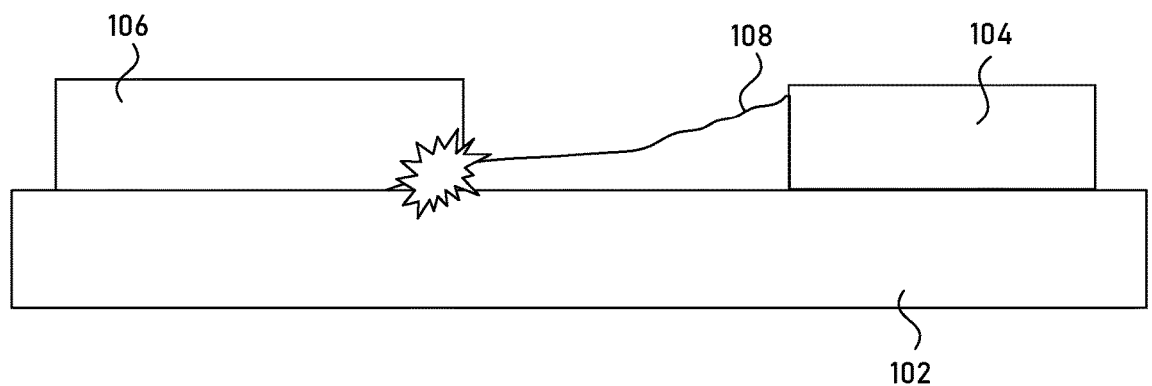
FIG. 1B depicts a cross sectional view of a semiconductor device assembly including a silicon spacer.

FIG. 1B depicts a cross sectional view of the semiconductor device assembly 100 across the A-A' plane shown in FIG. 1A. As shown, the underfill epoxy bleed out may cause the epoxy ingredients flow out of a keep out zone (KOZ) of the semiconductor die 104. KOZ is a space identified around a semiconductor die attached on the substrate, within which no other semiconductor die or components are allowed in order to prevent cross contamination caused by under fill epoxy bleed out. As shown in FIG. 1B, the underfill epoxy 108 may further bleed out to the silicon spacer region before attaching the silicon spacer 106 on the substrate 102. The residue under fill epoxy disposed under the silicon spacer 106 may cause the silicon spacer delamination during or after the semiconductor device assembly 100 is completed. In addition, the silicon spacers 106 may be cracked during operating the semiconductor device assembly 100 because the underneath epoxy residue may cause additional mechanical stress thereon. Further, the underfill epoxy 108 may flow above the top surface of the semiconductor die 104 (not shown), when the epoxy dispense location is configured to be close to the edge of the semiconductor die 104 to prevent underfill epoxy bleed out to the spacer region, causing a underfill material creeping defect. As microelectronics continue to move towards smaller form factor, dimensions of the semiconductor die and the KOZ are scaled, bringing in more challenges in semiconductor device assembly. It becomes increasingly critical to control the underfill epoxy bleed out to prevent damages to the spacers and reduce defects.

Figure 2:
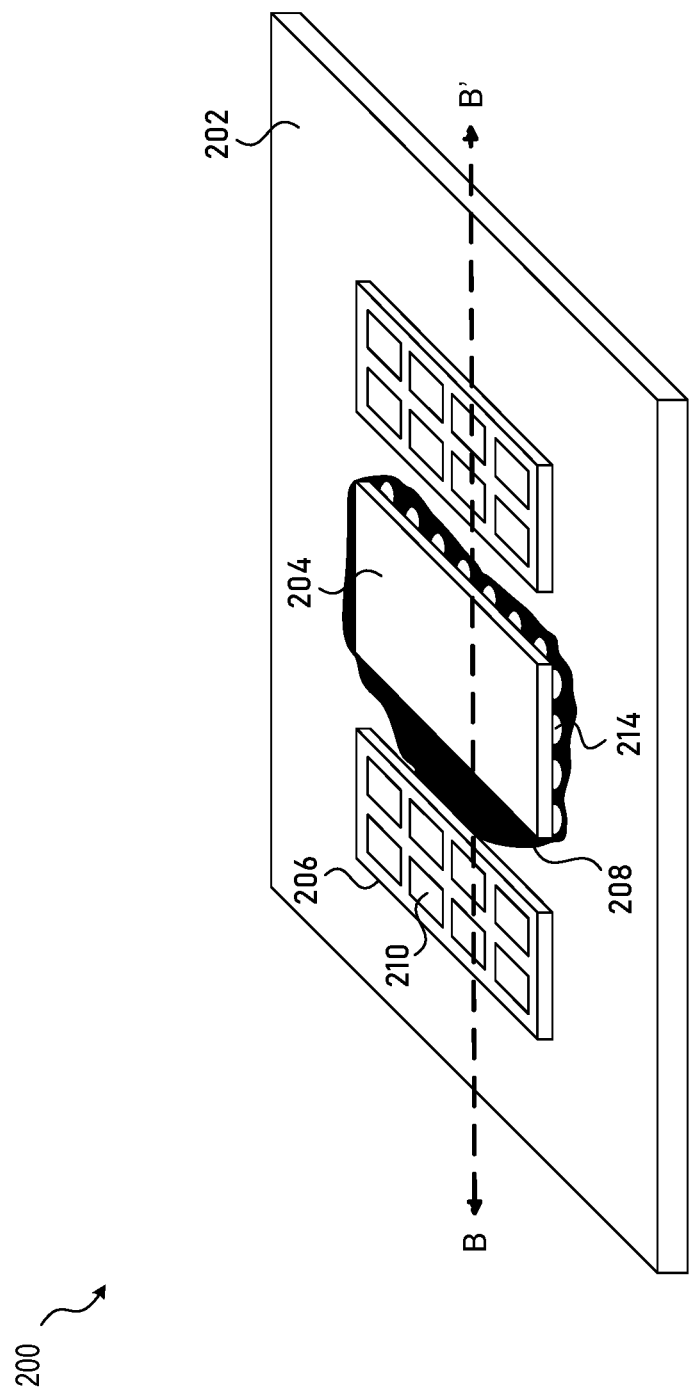
FIG. 2 depicts a perspective view of a semiconductor device assembly including spacers according to embodiments of the present technology.

FIG. 2 depicts a perspective view of a semiconductor device assembly 200 including spacers 210 according to embodiments of the present technology. As shown, the semiconductor assembly 200 include a substrate 202, a semiconductor die 204, and a plurality of spacers 210. The substrate 202 can be electrically coupled to the semiconductor die 204 and additional semiconductor dies (not shown) disposed above or adjacent to the semiconductor die 204, such that the semiconductor die 204 interfaces between the additional semiconductor dies and a host (e.g., a host processor of an electronic device) in communication with the semiconductor assembly 200. In this scenario, the semiconductor assembly has a relatively small footprint for high density semiconductor packaging, e.g., high bandwidth memory (HBM) applications.

The semiconductor device assembly 200 also includes a frame structure 206 within which the plurality of spacers are disposed. Specifically, the frame structure 206 has peripheral walls defining an enclosed region (e.g., a laterally-enclosed region open to the top) and is disposed adjacent to the semiconductor die 204. The plurality of spacers 210 are disposed on the substrate 202 and within the enclosed region of the frame structure 206. In one embodiment and as shown in FIG. 2, the semiconductor device assembly 200 includes 2 frame structures 206 each being disposed next to a longer edge of the semiconductor die 204. Each of the frame structures 206 has trench openings aligned in columns and rows. In particular, each of the frame structures 206 includes 8 enclosed regions, i.e., trench openings arranged in a 2×4 array. Further, each of the frame structures 206 includes 8 spacer pillars, each of the spacer pillars being disposed and restrained in the trench openings of the frame structures 206.

In some embodiments, the plurality of spacers 210 may be partially restrained in the frame structure 206. For example, the frame structure 206 may include a plurality of enclosures defined by its peripheral walls. The plurality of spacers 210 can be partially disposed within the plurality of enclosures, respectively. In this example, the plurality of spacers 206 may be taller than the frame structure 206 on the substrate 202.

In some embodiments, the substrate 202 may include, for example, a printed circuit board, a multimedia card substrate, or other suitable interposer having electrical connectors, such as metal traces, vias, or other suitable connectors. In various embodiment, the substrate 202 can be made of silicon, silicon-on-insulator, compound semiconductor (e.g., Gallium Nitride), or other suitable substrates and can have any of variety of integrated circuit components or functional features for managing memory or other components included in the semiconductor device assembly 200.

In some embodiments, the semiconductor device assembly 200 can be a memory device package and the semiconductor die 204 can be a controller die that is positioned under memory dies and configured to provide memory management for the memory package. In some embodiments, memory devices can be flash memory (e.g., eMMC memory, Universal Flash Storage, etc.) with multi-die memory packages suitable for mobile devices (e.g., smart phones, tablets, MP3 players, etc.), digital cameras, routers, gaming systems, navigation systems, computers, and other consumer electronic devices. For example, the multi-die memory packages can be, for example, flash memory packages, such as NAND packages, NOR packages, etc. The semiconductor die 204 can handle memory management on the semiconductor device assembly 200 so that a host processor is free to perform other tasks. In various embodiments, the semiconductor die 204 can include circuitry, software, firmware, memory, or combinations thereof.

In some embodiments, the semiconductor die 204 can be attached to the substrate 202 by a plurality of solder bumps 214 and an underfill adhesive material 208. The underfill adhesive material 208 can be any adhesive materials (e.g., epoxy resin, adhesive paste, etc.), an adhesive laminate (e.g., adhesive tape, die-attach or dicing die-attach film, etc.), or other suitable materials. As shown in FIG. 2, the underfill adhesive material 208 may bleed out and is further disposed in a dispense region between the semiconductor die 204 and adjacent frame structure 206. The underfill adhesive material 208 may have a greater thickness outside the outer edges of the semiconductor die 204 than under the semiconductor die 204 bottom surface, so as to accommodate the plurality of solder bumps 214 between the semiconductor die 204 and the substrate 202.

In some embodiments, the frame structure 206 can be made of solder resist. Solder resist is a permanent coating of a resin formulation and can be processed by a liquid photo-imagable (LPI) technique. Here, the solder resist used in the present technology can be in the form of a liquid photopolymer, epoxy, or epoxy-acrylate resin. The solder resist thickness is typically ranging from 10 um to 50 um with 5 um variations. Once dry after dispensing the solder resist on substrate 202, it is exposed to an image pattern required and then developed to reveal the required solder resist pattern. After developing, the solder resist is further heat cured to ensure a tough durable finish. In some other embodiments, the frame structure 206 may be made of insulating inks.

The frame structure 206, in the present technology, is configured to restrain the spacers 210 in the required regions. For example, the plurality of spacer pillars 210 are partially embedded in the patterns of the frame structure 206 and are disposed within the spherical walls of the frame structure 206. In addition, the frame structure 206 can prevent adhesive underfill material 208, e.g., underfill epoxy, from bleeding out and dispensed under the spacer 210. When the spacer 210 is being dispensed on the substrate 202, in this example, the frame structure 206 works as a permanent protective dam, protecting the spacer 210 from the underfill adhesive material 208.

In some embodiments, solder resists such as alkaline developable solder resist, UV curable solder resist, and/or thermally curable solder resist can be used to construct the frame structure 206 for the semiconductor device assembly 200. For example, alkaline developable solder resist can be implemented to shape a precise pattern onto the substrate 202 by exposing a negative film with the spacers 210 pattern via a screen print, spray coat, and/or curtain coat. Alternatively, the UV curable solder resist can be applied on the substrate 202 and be hardened under UV light for pattern printing via a screen print method. In addition, thermally curable solder resist can be utilized in the present technology through hardening the solder resist by applying heat.

Once the frame structure 206 is formed on the substrate 202, spacers 210 can be processed within the frame structure 206. In some embodiments, the spacers 210 can be made of solder pastes, e.g., a combination of metal solder particles and sticky flux with consistency of putty. The flux ingredient of the solder paste not only cleans the soldering surfaces of impurities and oxidation, but also provides an adhesive that holds the solder paste on the substrate 202. In modern technologies, the metal solder particles of the solder paste may be made of lead-free alloys.

In some embodiments, the spacer 210 may be dispensed to the frame structure 206 by a stencil-printing process. For example, solder paste can be dispensed into the patterns of the frame structure 206 by a solder paste printer. Alternatively, the solder paste may be dispensed pneumatically by jet printing, wherein the solder paste is ejected onto the substrate 202 through one or more nozzles. The printing of spacers 210 may followed by a reflow soldering process. A suitable reflow temperature may be selected to reflow the solder paste to suit them in the pattern of the frame structure 206. For example, the solder paste may be formed into a pillar shape with rectangular spherical edges in the horizontal plane, similar to the trench opening pattern of the frame structure 206, after the reflowing. Further, a reasonably rapid cool-down period may be required to solidify the spacers 210.

As shown in FIG. 2, the semiconductor device assembly 200 includes two frame structures and a plurality of spacers 210 disposed adjacent to both long edges of the semiconductor die 204. In some other embodiments, there may be additional frame structures and spacers embedded therein that are disposed on the substrate 202 and adjacent to the semiconductor 204. For example, the semiconductor device assembly 200 may also include frame structures adjacent to the shorter edges of the semiconductor die 204. In various embodiments, the semiconductor device assembly 200 may include multiple frame structures and spacers embedded therein, the multiple frame structures being adjacent to each edge of the semiconductor die 204.

Figure 3:
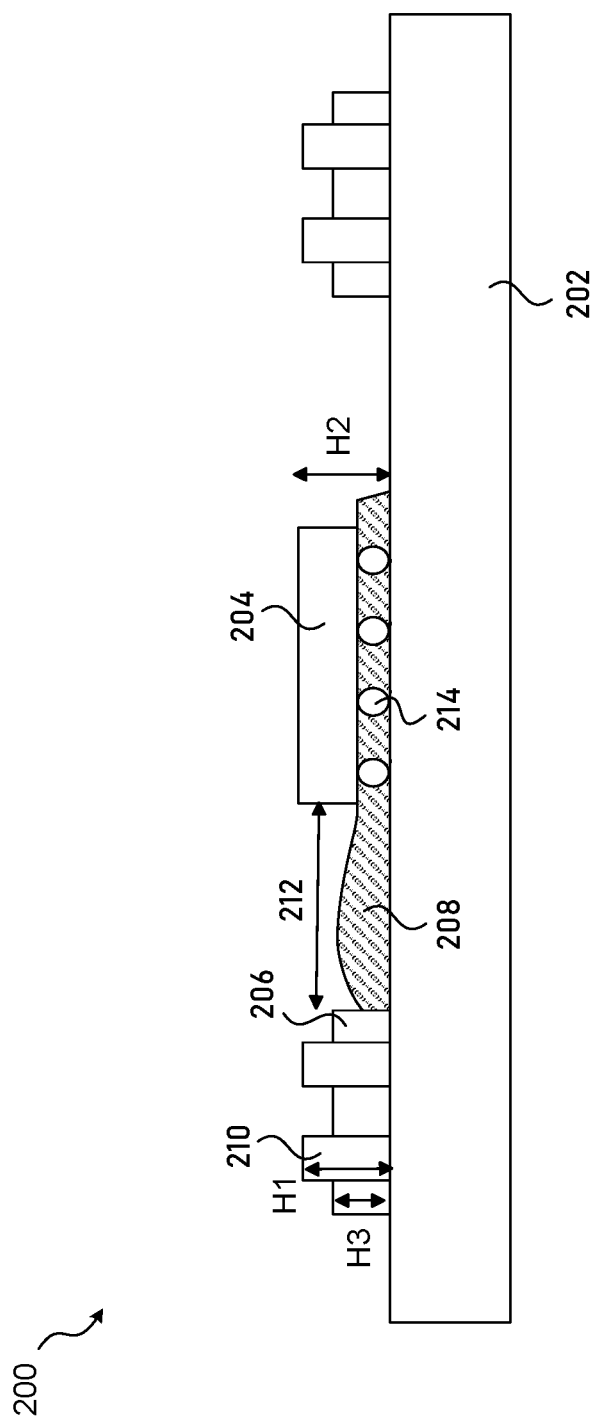
FIG. 3 depicts a cross sectional view of a semiconductor device assembly including spacers according to embodiments of the present technology.

Now turning to FIG. 3 which depicts a cross sectional view of the semiconductor device assembly 200 across the B-B' plane according to embodiments of the present technology. As described in FIG. 2, the semiconductor device assembly 200 may include two frame structures each disposed adjacent to the longer edge of the semiconductor die 204. In some embodiments, the plurality of spacers 210 are at least partially embedded in the frame structures 206 and in a shape of pillars. Specifically, each of the plurality of spacers 210 is in contact with the walls of the trench openings of the frame structures 206 and protruding upward. The semiconductor die 204 may be a controller flip chip die mounted to the substrate 202 via a plurality of solder bumps 214 and underfill adhesive material 208. The underfill material 208 may be an epoxy polymer such as aluminum-oxide, silica, or other know underfill materials. The semiconductor die 204 can perform various functionalities and is referred to herein as flip chip based on its connection to the substrate 202. Although the semiconductor die 204 is shown as a flip chip, other types of devices and chips can be used with the spacer 210 in the present technology. Here, the solder bumps 214 may spread between a bottom surface of the semiconductor die 204 and the substrate 202 for interconnections. In some other embodiments, the solder bumps 214 may be only located near outer edges of the semiconductor die 204, although are not so limited.

In some embodiments, additional semiconductor devices (not shown) may be mounted over the semiconductor devices shown in FIG. 3. The additional semiconductor devices can be an active die, such as a non-volatile storage memory such as NAND, a dynamic random-access memory (DRAM), or other memory chips, microprocessor chip, logic chip, or imaging chip as a bottom die in a die stack. The additional semiconductor devices can be mounted on the semiconductor die 204 and at least partially carried by the spacers 210 because of its relatively large size or configurations within the semiconductor assembly 200. For example, the additional semiconductor devices may overhang a portion of the semiconductor die 204 and a portion of the spacers 210. In various embodiments, the additional semiconductor devices may have a relatively large dimension, completely covering the top surface of the semiconductor die 204 and overhanging at least a portion of the spacers 210.

In some embodiments, other dies, die stacks, and/or components can be mounted to the substrate 202. It should also be understood that the spacer 210 and frame structure 206 can be disposed above any dies, die stacks, and/or components of the semiconductor assembly. For example, the spacer 210 and the frame structure 206 can be mounted to a semiconductor die disposed on the substrate 202 and the top surface of the spacer 210 can be leveled to a top surface of the semiconductor die 204, before further mounting any additional semiconductor dies/die stacks there above.

As shown in FIG. 3, the plurality of spacers 210 has a height H1 from the mounting surface of the substrate 202 to a top surface of the spacer 210. The spacer height H1 may be substantially the same as a height H2 of the peripheral walls of the frame structure 206 marked from the mounting surface of the substrate 202 to the top surface of the semiconductor die 204, within a tolerance. As a result, when the additional semiconductor devices are mounted over the semiconductor die 204 and the spacer 210, the additional semiconductor devices are leveled and there is no open space or gap created between the additional semiconductor devices and the top surfaces of the spacers 210 and the semiconductor die 204. As described, the spacers 210 are at least partially embedded in the frame structure 206 which is configured to constrain the spacer material such as solder paste. The height H3 of the frame structure 206 may be equal to or lower than the height H1 of the spacers 210. In some embodiments, the height H1 of the spacers may range from 50 um to 100 um. The height H3 of the frame structure 206 may range from 10 um to 50 um.

As described, the frame structure 206 may include a pattern of enclosed regions, e.g., trench opening arrays. The spacer materials, e.g., solder paste, can be dispensed into the trench opening arrays of the frame structure 206. Specifically, the spacer material may fulfill the trench openings. While the dispensing continues, the spacer material may further overstep the top surface of the trench openings/frame structure 206 and reveal a taller pillar structure. The spacer pillars may well maintain a rectangular spherical shape from the trench openings until reaching the height H1 and forming a planar top surface due to its high viscosity.

In some embodiments, the underfill adhesive material 208 can be dispensed into the KOZ 212 between the frame structure 206 and the adjacent edge of the semiconductor die 204. The KOZ 212 may have a length ranging from 500 um to 1 mm. As described, the underfill adhesive material 208 can be firstly dispensed on the substrate 202 in liquid phase and then uniformly drawn into the interior spaces between the semiconductor die 204 bottom surface and the substrate 202 top surface based on capillary action. Even though the dispensing location can be configured to be closer to the edge of the semiconductor 204, the underfill material 208 may inevitably bleed out towards the spacers 210. In the present technology, the underfill material bleed out stops at the frame structure 206, which is disposed between the underfill material 208 and the spacers 210. Here, the frame structure 206 performs as a mechanical barrier or a dam to reduce the underfill material bleed out into the region of the spacers 210, as shown in FIG. 3.

Figure 4A:
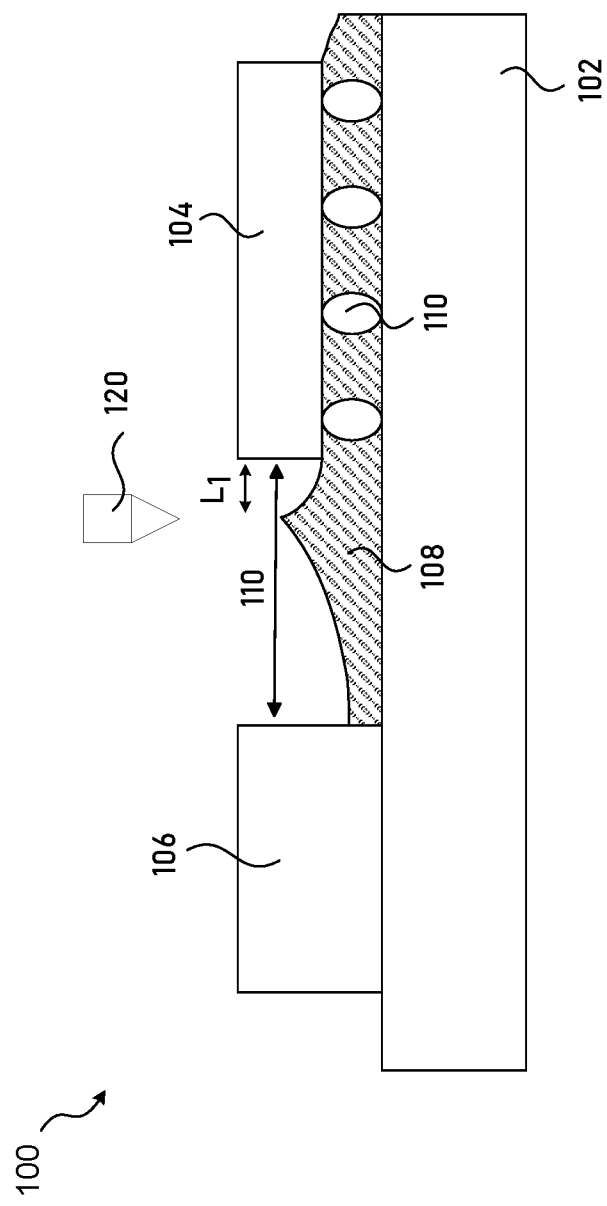
FIG. 4A depicts a cross sectional view of a semiconductor device assembly including a spacer and a semiconductor die.

FIG. 4A depicts a cross sectional view of the semiconductor device assembly 100 with the silicon spacer 106 and the semiconductor die 104. This semiconductor device assembly 100 also includes a KOZ 110 around one edge of the semiconductor die 104. Generally, the underfill epoxy material 108 is dispensed from a nozzle 120 disposed above the KOZ 110 region and drawn into the interior space between the semiconductor die 104 and the substrate 102. To improve the underfill efficiency, the dispense location 1/nozzle position is usually configured to be closer to the edge of the semiconductor die 104. The dispense location 1 may have a distance L1 to the adjacent edge of the semiconductor die 104. The distance L1 may be ranging from 20 um to 200 um.

This configuration can be also implemented for semiconductor device assemblies including traditional silicon spacers to reduce epoxy material bleed out by keeping the dispense location further away from adjacent silicon spacers, as shown in FIG. 4A. Along with semiconductor device scaling, however, this configuration is getting more challenging. First, the KOZ 110 length may be reduced to enhance the density of semiconductor dies within the semiconductor assemblies. The reduced length of KOZ 100 inevitably increases the risk of underfill epoxy 108 bleeding out towards to the silicon spacer 106, causing more silicon spacer cracking or delamination defects. Second, the thickness of the semiconductor die 104 may be reduced when scaling the semiconductor dies. A thinner/lower top surface of the semiconductor die 104 may increase a risk of underfill adhesive material 108 creeping defects, i.e., the underfill epoxy flow on the top surface of the semiconductor die 104. The creeping defect may range up to 200 um from an edge to a center above the top surface of the semiconductor die 104. In addition, the underfill epoxy flow along the adjacent edge of the semiconductor die 104 is expected to be faster to the underneath region and its opposite end edge, therefore causing an accumulation of underfill epoxy at the adjacent edge of the semiconductor die 104 and increasing the risk of creeping defect.

Figure 4B:
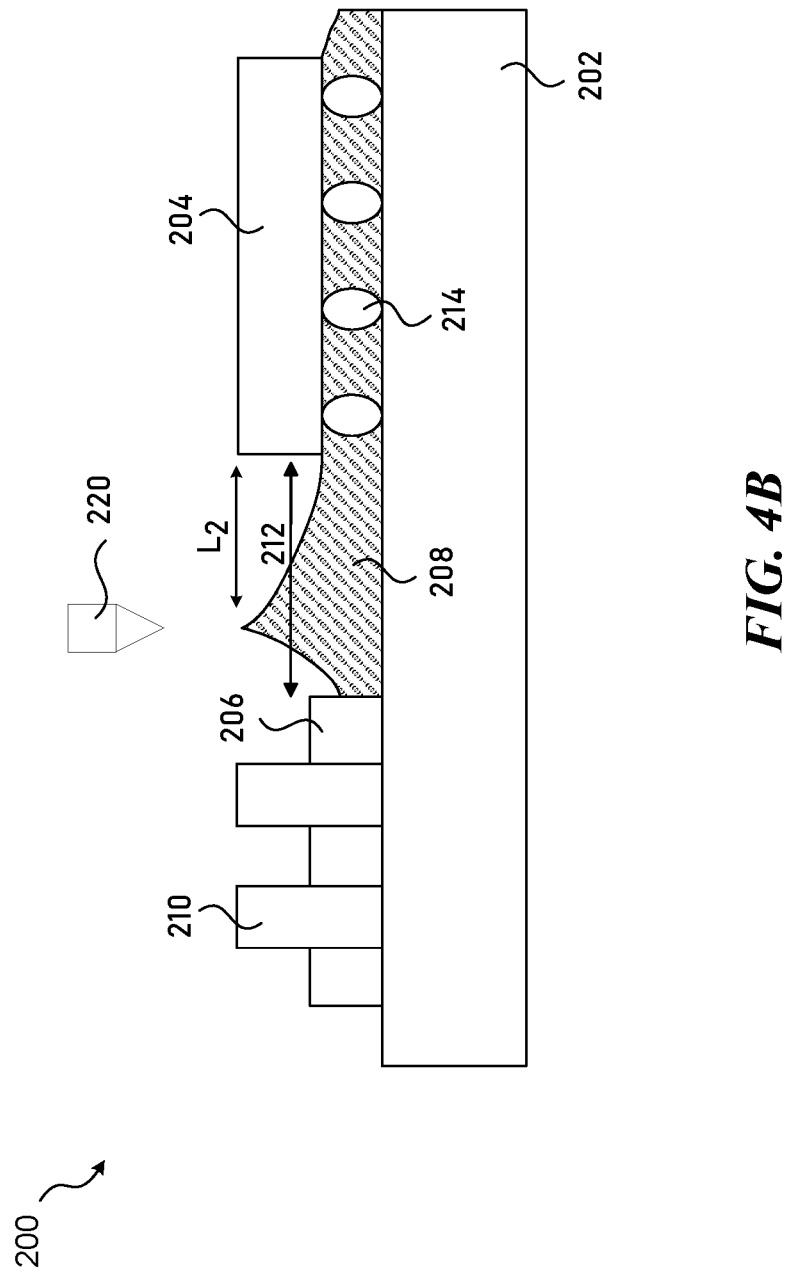
FIG. 4B depicts a cross sectional view of a semiconductor device assembly including a spacer and a semiconductor die according to embodiments of the present technology.

FIG. 4B depicts a cross sectional view of the semiconductor device assembly 200 according to the present technology. As described, the spacer 210 can be restrained in the frame structure 206, both the spacers 210 and the frame structure 206 being adjacent to the semiconductor die 204. The underfill adhesive material 208 can be dispensed onto the substrate 202 through the KOZ 212 and then drawn into the interior space between the semiconductor die 204 bottom surface and the substrate 202 top surface.

In some embodiments and as shown in FIG. 4B, the underfill adhesive material 208 can be dispensed on the substrate 202 from a nozzle 220 disposed above the KOZ 212. For example, the dispense location 2/nozzle 220 may have a distance L2 to the adjacent edge of the semiconductor die 204. The L2 may be larger than the distance L1 described in semiconductor device assembly 100. Here, the distance L2 may be ranging from 175 um to 400 um. In this example, the frame structure 206 restrains the spacers 210 and surrounds the spacers 210. As shown in FIG. 4B, the frame structure 206 performs as a dam to prevent underfill material 208 bleeding out into the spacer regions. Here, adjusting the underfill material dispensing location/nozzle 220 position to be closer to the frame structure will not cause any degradation on the spacers 210 because the frame structure 206 can effectively isolate the underfill material 208 from the spacers 210. In addition, the adjusted dispense location 2 further away from the adjacent edge of the semiconductor die 204 may help reduce the risk of underfill material creeping defects. For example, by adjusting the underfill material 208 dispense location closer to the edge of the frame structure 206, the underfill material 208 can be less accumulated at the adjacent edge of the semiconductor die 204. Therefore, the risk of creeping the underfill material 208 too far along the top surface of the semiconductor die 204 can be effectively reduced.

An expected advantage and benefit of the spacers 210 in the present technology are the ability to design the size (e.g., length, width), shapes, thickness, and location of the spacers 210 as well as the frame structures 206 within the semiconductor assembly 200. FIGS. 5A-5D depict planar views of spacers restrained in peripheral walls of frame structures with various shapes and sizes for semiconductor device assembly according to embodiments of the present technology.

Figure 5D:
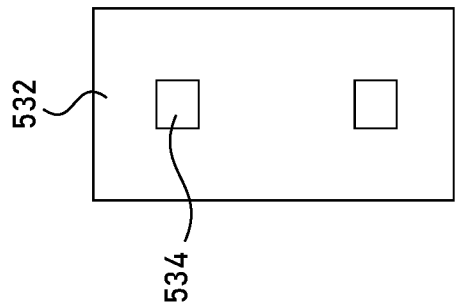
FIG. 5A-5D depict planar views of spacers with various shapes and sizes for semiconductor device assembly according to embodiments of the present technology.
Figure 5C:
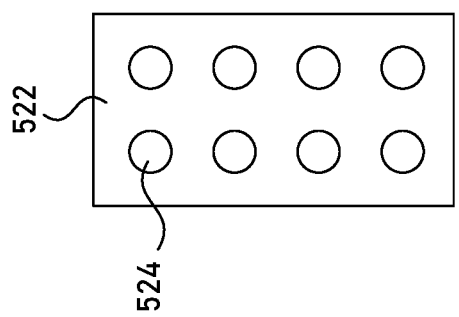
Figure 5B:
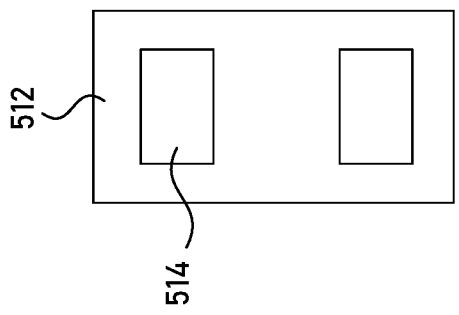
Figure 5A:
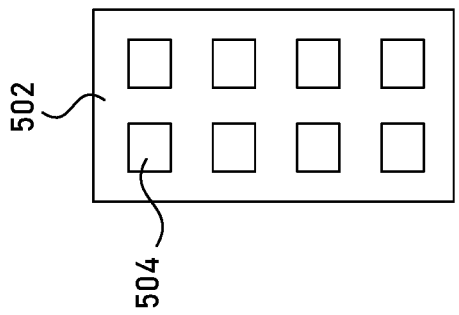

As described, a plurality of spacers can be restrained in a frame structure. For example, spacers 504 can be arranged in columns and rows within the frame structure 502. As shown in FIG. 5A, the spacer pillars 504 can be arranged in a 2×4 array and disposed in the frame structure 502. Each of the spacer pillars 504 is in a square shape with an edge length ranging from 50 um to 500 um. Alternatively, as shown in FIG. 5B, spacers can be arranged only in a column within a frame structure. For example, two spacer pillars 514 can be arranged vertically within the frame structure 512. Each of these spacer pillars 514 may have a larger size than the spacer 504, e.g., having an edge length ranging from 100 um to 1 mm.

The spacers for the semiconductor device assembly in the present technology can be in different shapes. The shape of the spacers may be originated from the enclosed regions formed within the frame structures. For example, as shown in FIG. 5C, the spacer pillars 524 each have a circular shape in the horizontal plane. In addition, the spacer pillars 524 are arranged in a 2×4 array within the frame structure 522. Each of the spacer pillars 524 may have a similar dimension to the spacer pillars 504, e.g., having a radius ranging from 50 um to 500 um.

The semiconductor device assembly may include smaller size spacers to save the fabrication cost. For example, as shown in FIG. 5D, two spacer pillars 534 can be arranged in a column and restrained in the frame structure 532. Each of the spacer pillars 534 may be in a square shape and have a similar size to the spacer pillars 504, e.g., having an edge length ranging from 50 um to 500 um. The frame structures shown in FIGS. 5A-5D are all in a rectangular peripheral shape. In various embodiments, the frame structures' shape can be various. For example, the frame structure may be in a square peripheral shape, a circular shape, or a polygon shape.

This flexible sizing and shapes of the spacers allow for different configurations of the semiconductor assemblies to accommodate different semiconductor die scaling requirement and different additional semiconductor dies/die stacks configurations. For example, for a HBM assembly including a number of stacked memory dies disposed above the spacers, a configuration of a smaller number of spacers each having a larger size may be implemented to reduce the mechanical stress applied on each of the spacers. Alternatively, the HBM assembly may utilize a large number of spacers each having a relative smaller size for the same purpose. In another example, for semiconductor device assembly in which mechanical stress is not a concern, a smaller number of spacers each having a smaller size may be a good fit.

Figure 6:
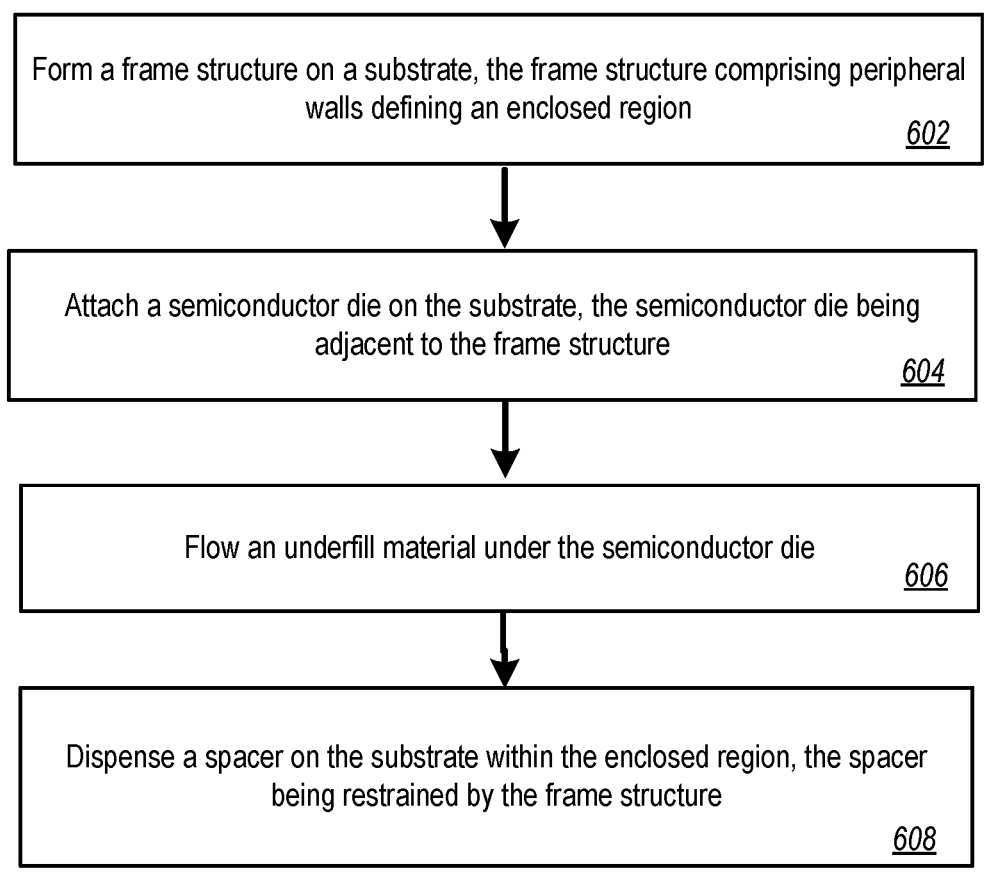
FIG. 6 is a flow chart illustrating a method of processing a semiconductor device assembly with spacers according to embodiments of the present technology.

Turning now to FIG. 6, a flow chart illustrating a method 600 of forming spacers for semiconductor device assemblies. The method 600 includes forming a frame structure on a substrate, the frame structure comprising peripheral walls defining an enclosed region, at 602. For example, the frames structures 206 can be fabricated on the substrate 202 and adjacent to the semiconductor die 204. The frame structures 206 can be made by solder resist and dispensed by the LPI technique. In addition, the frame structure 206 may include peripheral walls that define enclosed regions, as shown in FIG. 2.

The method 600 also includes attaching a semiconductor die on the substrate, the semiconductor die being adjacent to the frame structure, at 604. For example, the semiconductor die 204 can be attached on the substrate 202 by a plurality of solder bumps 214. The semiconductor die 204 being placed adjacent to the frame structure 206.

Further, the method 600 includes flowing an underfill material under the semiconductor die, at 606. For example, adhesive underfill material 208 can be dispensed into the KOZ 212 between the frame structure 206 and the adjacent edge of the semiconductor die 204. The underfill adhesive material 208 can be firstly dispensed on the substrate 202 in liquid phase and then uniformly drawn into the interior spaces between the semiconductor die 204 bottom surface and the substrate 202 top surface based on capillary action.

Lastly, the method 600 includes dispensing a spacer on the substrate within the enclosed region, the spacer being restrained by the frame structure, at 608. For example, the spacer material 210 can be dispensed in the enclosed region of the frame structure 206. The spacer pillars 210 can be made of solder paste and dispensed by a stencil-printing process. Moreover, the spacer pillars 210 can be partially embedded in the frame structure 206 and have a planar top surface, as shown in FIG. 3.

Figure 7:
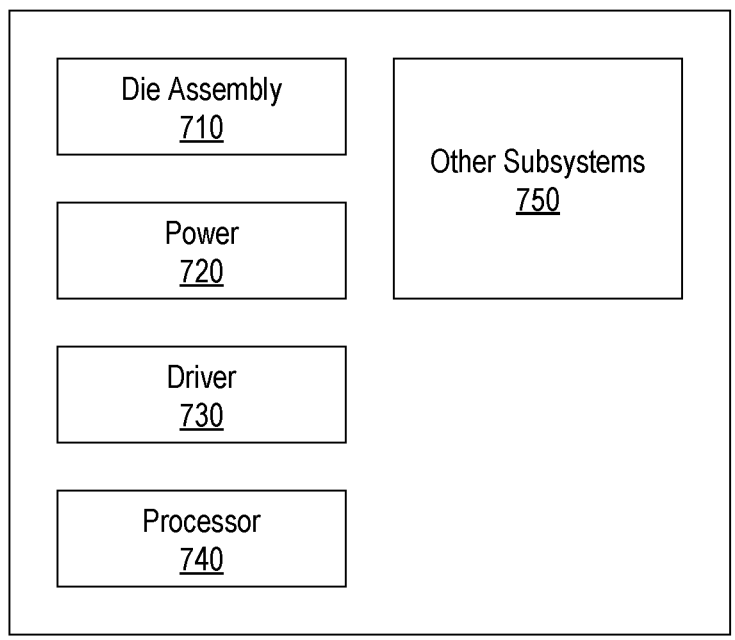
FIG. 7 is a schematic view of a system that includes a semiconductor device configured according to embodiments of the presented technology.

Any one of the semiconductor structures described above with reference to FIGS. 2-5D can be incorporated into any of a myriad of larger and/or more complex systems, a representative example of which is system 700 shown schematically in FIG. 7. The system 700 can include a semiconductor device 710, a power source 720, a driver 730, a processor 740, and/or other subsystems or components 750. The semiconductor device 710 can include features generally similar to those of the semiconductor devices described above and can therefore include spacers and frame structures described in the present technology. The resulting system 700 can perform any of a wide variety of functions, such as memory storage, data processing, and/or other suitable functions. Accordingly, representative systems 700 can include, without limitation, hand-held devices (e.g., mobile phones, tablets, digital readers, and digital audio players), computers, and appliances. Components of the system 700 may be housed in a single unit or distributed over multiple, interconnected units (e.g., through a communications network). The components of the system 700 can also include remote devices and any of a wide variety of computer-readable media.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In accordance with one aspect of the present disclosure, the semiconductor devices illustrated above could be memory dice, such as dynamic random access memory (DRAM) dice, NOT-AND (NAND) memory dice, NOT-OR (NOR) memory dice, magnetic random access memory (MRAM) dice, phase change memory (PCM) dice, ferroelectric random access memory (Fe RAM) dice, static random access memory (SRAM) dice, or the like. In an embodiment in which multiple dice are provided in a single assembly, the semiconductor devices could be memory dice of a same kind (e.g., both NAND, both DRAM, etc.) or memory dice of different kinds (e.g., one DRAM and one NAND, etc.). In accordance with another aspect of the present disclosure, the semiconductor dice of the assemblies illustrated and described above could be logic dice (e.g., controller dice, processor dice, etc.), or a mix of logic and memory dice (e.g., a memory controller die and a memory die controlled thereby).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "top," "bottom," "over," "under," "above," and "below" can refer to relative directions or positions of features in the semiconductor devices in view of the orientation shown in the Figures. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
    a substrate;
    a frame structure disposed on the substrate, the frame structure comprising peripheral walls defining an enclosed region;
    a spacer disposed on the substrate within the enclosed region and restrained by the frame structure, the spacer being nonconductive;
    a semiconductor die disposed on the substrate and disposed adjacent to the frame structure and the spacer; and
    an underfill material layer that is in contact with the peripheral walls of the frame structure and that extends under the semiconductor die.

2. The semiconductor device assembly of claim 1, wherein the frame structure comprises solder resist, and wherein the spacer comprises solder paste.

3. The semiconductor device assembly of claim 1, wherein the frame structure is configured to prevent the underfill material layer from horizontally dispensing under the spacer disposed on the substrate.

4. The semiconductor device assembly of claim 1, wherein a dispense space exists between the semiconductor die and the adjacent frame structure, and wherein the dispense space has a length between the semiconductor die and the adjacent frame structure, the dispense space length ranging from 500 um to 1 mm.

5. The semiconductor device assembly of claim 4, wherein the underfill material layer is disposed in the dispense space.

6. The semiconductor device assembly of claim 1, wherein the spacer has a planar top surface.

7. The semiconductor device assembly of claim 6, wherein the top surface of the spacer is equal to or higher than a top surface of the frame structure.

8. The semiconductor device assembly of claim 7, wherein the frame structure has a height ranging from 10 um to 50 um, and wherein the spacer has a height ranging from 50 um to 100 um.

9. The semiconductor device assembly of claim 1, wherein the peripheral walls define a plurality of enclosures including the enclosure, and wherein the spacer comprises a plurality of pillars that are at least partially restrained in corresponding ones of the plurality of enclosures of the frame structure.

10. The semiconductor device assembly of claim 9, wherein the plurality of pillars have at least one of a rectangular peripheral shape, a square peripheral shape, a circular peripheral shape, or a polygon peripheral shape in a horizontal plane.

11. The semiconductor device assembly of claim 1, wherein the frame structure has at least one of a rectangular peripheral shape or a square peripheral shape in a horizontal plane.

12. The semiconductor device assembly of claim 1, further comprising a plurality of memory dies, the memory dies being disposed above the semiconductor die and at least partially carried by the spacer.

13. A substrate for a semiconductor device assembly, the substrate comprising:
- a first surface including a plurality of die contacts;
- a second surface opposite the first surface including a plurality of external contacts operably coupled to the plurality of die contacts;
- a frame structure at the first surface, the frame structure comprising peripheral walls defining an enclosed region exclusive of the plurality of die contacts and configured to restrain a spacer; and
- an underfill material layer that is in contact with the peripheral walls of the frame structure and that extends through the plurality of die contacts.

14. The substrate of claim 13, wherein the frame structure comprises solder resist, and wherein the spacer comprises solder paste.

15. The substrate of claim 13, wherein the frame structure is configured to prevent the underfill material layer from horizontally dispensing into the enclosed region.

16. A method of forming a semiconductor assembly, comprising:
- forming a frame structure on a substrate, the frame structure comprising peripheral walls defining an enclosed region;
- attaching a semiconductor die to the substrate, the semiconductor die being adjacent to the frame structure;
- dispensing a spacer on the substrate within the enclosed region, the spacer being restrained by the frame structure; and
- dispensing an underfill material within a dispense space that exists between the semiconductor die and the frame structure to form an underfill material layer, the underfill material layer being in contact with the peripheral walls of the frame structure and extending under the semiconductor die.

17. The method of forming the semiconductor assembly of claim 16, wherein the frame structure is configured to prevent the underfill material layer from horizontally dispensing into the enclosed region.

18. The method of forming the semiconductor assembly of claim 16, further comprising attaching a plurality of memory dies on the semiconductor die, the plurality of memory dies being at least partially carried by the spacer.

19. The method of forming the semiconductor assembly of claim 16, wherein the spacer has a top planar surface.

* * * * *